United States Patent
Beaudoin et al.

(10) Patent No.: US 11,255,905 B2
(45) Date of Patent: Feb. 22, 2022

(54) FAULT TOLERANT SYNCHRONIZER

(71) Applicant: TEXAS INSTRUMENTS INCORPORATED, Dallas, TX (US)

(72) Inventors: Denis Roland Beaudoin, Rowlett, TX (US); Samuel Paul Visalli, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 42 days.

(21) Appl. No.: 16/152,531

(22) Filed: Oct. 5, 2018

(65) Prior Publication Data

US 2020/0110132 A1 Apr. 9, 2020

(51) Int. Cl.
*G01R 31/317* (2006.01)
*G01R 31/3177* (2006.01)
*H03K 3/037* (2006.01)
*H03K 19/21* (2006.01)

(52) U.S. Cl.
CPC ... *G01R 31/31726* (2013.01); *G01R 31/3177* (2013.01); *G01R 31/31703* (2013.01); *H03K 3/037* (2013.01); *H03K 19/21* (2013.01)

(58) Field of Classification Search
None
See application file for complete search history.

(56) References Cited

U.S. PATENT DOCUMENTS

| 7,007,186 | B1* | 2/2006 | Li | G06F 1/12 713/400 |
| 7,330,489 | B1* | 2/2008 | Benning | H04J 3/0685 370/506 |
| 8,161,441 | B2* | 4/2012 | Wang | G06F 30/327 716/108 |
| 8,365,049 | B2* | 1/2013 | Pribbernow | H03K 3/0375 714/780 |
| 2006/0198479 | A1* | 9/2006 | Hsu | H04L 7/0012 375/354 |
| 2015/0188649 | A1* | 7/2015 | Buckler | G06F 1/10 370/503 |

* cited by examiner

*Primary Examiner* — Phung M Chung
(74) *Attorney, Agent, or Firm* — Ebby Abraham; Charles A. Brill; Frank D. Cimino

(57) ABSTRACT

A synchronization circuit includes a first synchronizer, a second synchronizer, and selection circuitry. The first synchronizer is configured to synchronize a received signal to a clock signal. The second synchronizer is disposed in parallel with the first synchronizer and configured to synchronize the received signal to the clock signal. The selection circuitry is coupled to the first synchronizer and the second synchronizer. The selection circuitry is configured to provide an output value generated by the first synchronizer at an output terminal of the synchronization circuit based on the output value generated by the first synchronizer being the same as an output value generated by the second synchronizer.

18 Claims, 4 Drawing Sheets

FAULT TOLERANT SYNCHRONIZER

BACKGROUND

It is often necessary for a digital system operating in one clock domain to communicate with another digital system that operates in different clock domain. When such communication is necessary, signals passed between the systems are resynchronized to clock timing of the receiving system. Synchronizer circuits disposed at the boundaries of the digital systems provide the synchronization.

SUMMARY

A synchronizer circuit that detects and compensates for soft errors is disclosed herein. In one example, a synchronization circuit includes a first synchronizer, a second synchronizer, and selection circuitry. The first synchronizer is configured to synchronize a received signal to a clock signal. The second synchronizer is disposed in parallel with the first synchronizer and configured to synchronize the received signal to the clock signal. The selection circuitry is coupled to the first synchronizer and the second synchronizer. The selection circuitry is configured to provide an output value generated by the first synchronizer at an output terminal of the synchronization circuit based on the output value generated by the first synchronizer being the same as an output value generated by the second synchronizer.

In another example, a synchronization circuit includes an input terminal, a first flip-flop, a second flip-flop, an exclusive-OR circuit, and a multiplexer. The first flip-flop includes a data input terminal, a clock terminal, and an output terminal. The data input terminal is coupled to the input terminal of the synchronizer circuit. The second flip-flop includes a data input terminal, a clock terminal, and an output terminal. The data input terminal of the second flip-flop is coupled to the input terminal of the synchronizer circuit. The clock terminal of the second flip-flop is coupled to the clock terminal of the first flip-flop. The exclusive-OR circuit includes a first input terminal, a second input terminal, and an output terminal. The first input terminal is coupled the output terminal of the first flip-flip. The second input terminal is coupled to the output terminal of the second flip-flop. The multiplexer includes a first input terminal, a second input terminal, and a control terminal. The first input terminal is coupled to the first input terminal of the exclusive-OR circuit. The control terminal is coupled to the output terminal of the exclusive-OR circuit.

In a further example, a method for synchronization includes synchronizing an input signal to a clock in a first synchronizer. The input signal is also synchronized to the clock in a second synchronizer that is connected in parallel with the first synchronizer. An output of the first synchronizer is compared to an output of the second synchronizer. A synchronized output value is set to be an output value of the first synchronizer based on the output of the first synchronizer being the same as the output of the second synchronizer.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Synchronizer circuits employ flip-flops to synchronize an asynchronous input signal to a system clock. As device geometry shrinks, flip-flops become more susceptible to soft errors caused by cosmic radiation, power supply noise, or other external events. Smaller device geometries also allow for an increase in device density with a corresponding increase in asynchronous clocking. Soft errors in asynchronous clocking circuitry can produce a variety of faults in a system. In the past, the limited nature of asynchronous clocking allowed soft errors in synchronization flip-flops to be ignored, but as device geometries shrink, the errors in synchronization become more significant, especially in safety critical applications that require protection from soft errors.

The synchronization circuit disclosed herein detects soft errors in synchronization flip-flops and allows a synchronizer output to change state only after any soft errors are resolved. Implementations of the synchronization circuit compare the outputs of two parallel synchronizers. If the two outputs are the same logic level, then the output of one of the synchronizers is provided to be the current output of the synchronization circuit. If the two outputs are different logic levels, then a previously captured output of the synchronization circuit is provided to be the current output of the synchronization circuit. Thus, implementations of the synchronizer circuit reduce or eliminate the errors in the output of the synchronizer circuit caused by soft errors in the synchronizer flip-flops.

Figure 1:
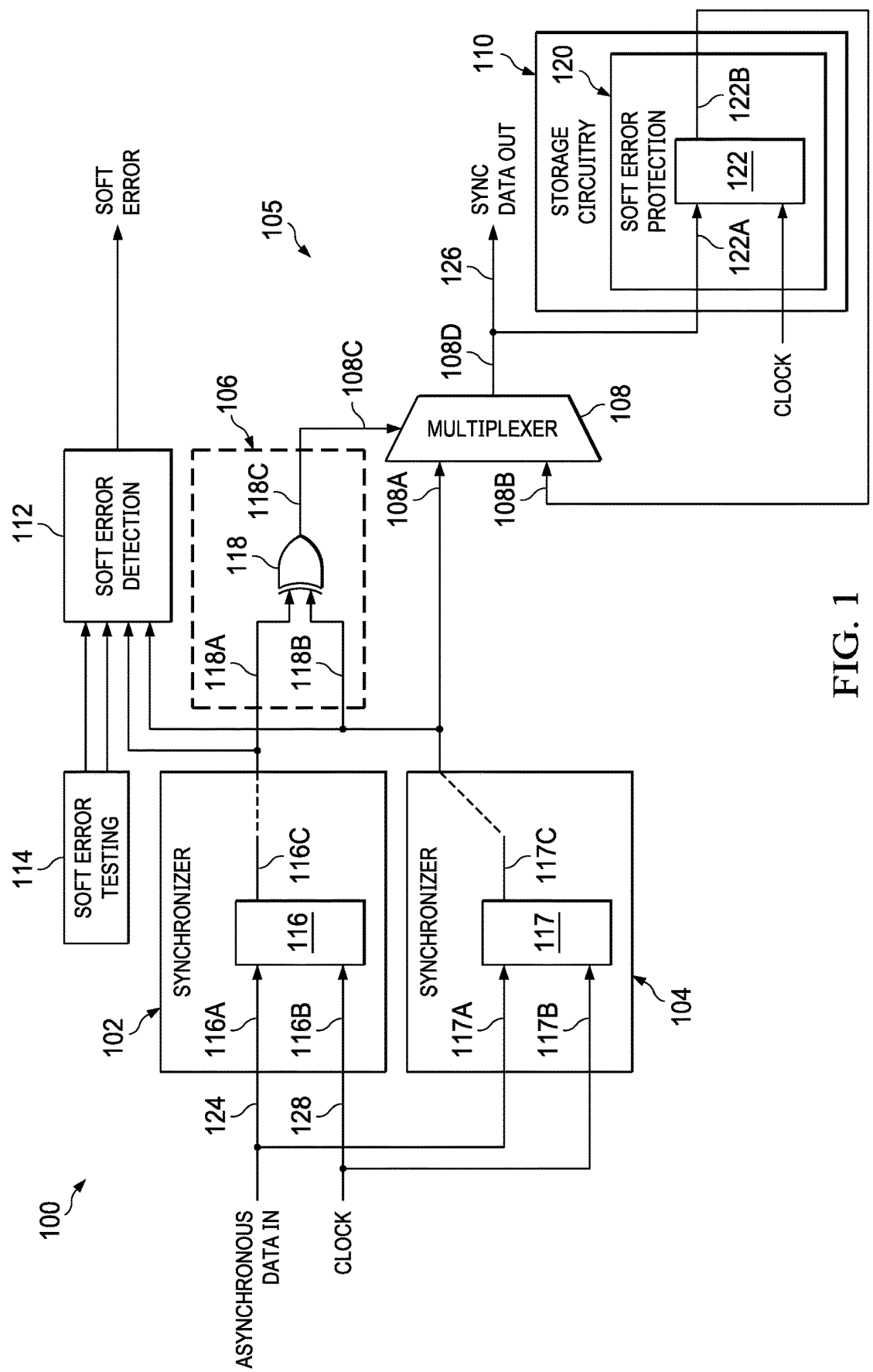
FIG. 1 shows a block diagram for an example synchronization circuit in accordance with the present disclosure.

FIG. 1 shows a block diagram for an example synchronization circuit 100 in accordance with the present disclosure. The synchronization circuit 100 includes a synchronizer 102, a synchronizer 104, and selection circuitry 105. Some implementations of the 100 also include soft error detection circuitry 112, and soft error testing circuitry 114. The synchronization circuit 100 includes an input terminal 124 for receiving an asynchronous input signal, a clock terminal 128 for receiving a synchronization clock signal;

and an output terminal 126 for providing a synchronized output signal to circuitry external to the synchronization circuit 100. The input terminal 124 is coupled to the synchronizer 102 and the synchronizer 104.

The synchronizer 102 and the synchronizer 104 are connected in parallel, such that each of the synchronizer 102 and the synchronizer 104 independently synchronizes the asynchronous input signal received at the input terminal 124 to the clock signal received at the clock terminal 128. The synchronizer 102 includes one or more flip-flops 116 to synchronize the asynchronous input signal received at the input terminal 124 to the clock signal received at the clock terminal 128. The flip-flop 116 includes an input terminal 116A, a clock terminal 116B, and an output terminal 116C. The input terminal 116A is coupled to the input terminal 124, and the clock terminal 116B is coupled to the clock terminal 128. Similarly, the synchronizer 104 includes one or more flip-flops 117 to synchronize the asynchronous input signal received at the input terminal 124 to the clock signal received at the clock terminal 128. The flip-flop 117 includes an input terminal 117A, a clock terminal 117B, and an output terminal 117C. The input terminal 117A is coupled to the input terminal 124, and the clock terminal 117B is coupled to the clock terminal 128.

The selection circuitry 105 is coupled to the synchronizer 102 and the synchronizer 104. The selection circuitry 105 includes comparison circuitry 106, a multiplexer 108, and storage circuitry 110. The comparison circuitry 106 compares the output signals generated by synchronizer 102 and the synchronizer 104, and provides a result of the comparison to the multiplexer 108. In some implementations, the selection circuitry 105 may include an exclusive-OR circuit 118 (or other comparison circuitry, e.g., exclusive-NOR, etc.) that compares the output signals generated by synchronizer 102 and the synchronizer 104. Some implementations of the comparison circuitry 106 include other circuitry (e.g., exclusive-NOR circuitry) to compare the output signals generated by synchronizer 102 and the synchronizer 104. The exclusive-OR circuit 118 includes an input terminal 118A, an input terminal input terminal 1186, and an output terminal 118C. The input terminal 118A is coupled to the output terminal 116C, and the input terminal 1186 is coupled to the output terminal 117C.

The multiplexer 108 includes an input terminal 108A, an input terminal 108B, a control terminal 108C, and an output terminal 108D. The control terminal 108C is coupled to the output terminal 118C, the input terminal 108A is coupled to an output of the synchronizer 102 or the synchronizer 104. The input terminal 108B is coupled to the storage circuitry 110, and the output terminal 108D is coupled to the storage circuitry 110. The multiplexer 108 routes the signal at the input terminal 108A to the output terminal 108D if the signal at the control terminal 108C indicates that the outputs of the synchronizer 102 and the synchronizer 104 are the same, and routes the signal at the input terminal 108B to the output terminal 108D if the signal at the control terminal 108C indicates that the outputs of the synchronizer 102 and the synchronizer 104 are not the same.

The storage circuitry 110 stores the synchronized output signal produced by the multiplexer 108. The storage circuitry 110 includes a flip-flop 122 or other storage circuit, and soft-error protection circuitry 120 coupled to the flip-flop 122. The flip-flop 122 includes an input terminal 122A and an output terminal 122B. The input terminal 122A is coupled to the output terminal 108D, and the output terminal 122B is coupled to the input terminal 108B. The soft-error protection circuitry 120 protects the flip-flop 122 from soft errors. For example, the soft-error protection circuitry 120 may include error correction code (ECC) circuitry that corrects the output of the flip-flop 122 if a soft error occurs in the flip-flop 122.

The synchronization circuit 100 mitigates the effects of soft errors in the synchronizer 102 and the synchronizer 104 by producing, at the output terminal 126, the output of the synchronizer 104 if the output of the synchronizer 102 is the same as the output of the synchronizer 104, and producing, at the output terminal 126, a stored prior output of the multiplexer 108 if the output of the synchronizer 102 is not the same as the output of the synchronizer 104. If a soft error changes the output of the one of the synchronizer 102 or the synchronizer 104, the selection circuitry 105 provides the stored prior output of the multiplexer 108 at the output terminal 126.

The soft error detection circuitry 112 is coupled to the synchronizer 102 and the synchronizer 104. The soft error detection circuitry 112 monitors the output of the synchronizer 102 and the synchronizer 104 to identify the presence of a soft error in the synchronizer 102 or the synchronizer 104. If the soft error detection circuitry 112 identifies a soft error in the output of the synchronizer 102 or the output of the synchronizer 104, the soft error detection circuitry 112 asserts an output to notify circuitry external to the synchronization circuit 100 of the soft error.

The soft error testing circuitry 114 is coupled to the soft error detection circuitry 112. The soft error testing circuitry 114 generates signals to test soft error detection in the soft error detection circuitry 112. The soft error testing circuitry 114 generates signal sequences that replicate the outputs of the synchronizer 102 and the synchronizer 104 when a soft error occurs in the synchronizer 102 or the synchronizer 104. The soft error detection circuitry 112 processes the signals generated by the soft error testing circuitry 114 to test soft error detection.

Figure 2:
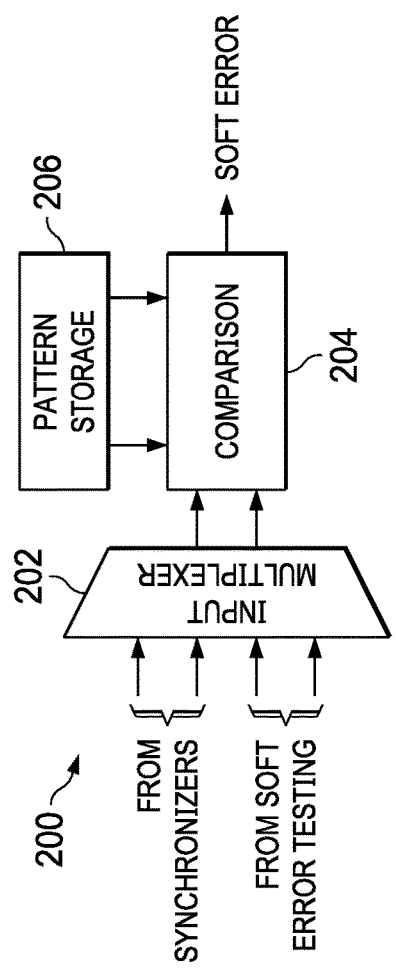
FIG. 2 shows a block diagram for an example soft error detection circuit in accordance with the present disclosure.

FIG. 2 shows a block diagram for an example soft error detection circuit 200 in accordance with the present disclosure. The soft error detection circuit 200 is an implementation of the soft error detection circuitry 112. The soft error detection circuit 200 includes an input multiplexer 202, comparison circuitry 204, and sequence storage 206. The input multiplexer 202 selects either the outputs of the synchronizer 102 and synchronizer 104, or the output signals produced by the soft error testing circuitry 114 to process for detection of soft errors. For example, to test the soft error detection circuit 200, the input multiplexer 202 selects the output signals produced by the soft error testing circuitry 114, and in normal operating conditions the input multiplexer 202 selects the outputs of the synchronizer 102 and the synchronizer 104.

In some implementations of the soft error detection circuit 200, the sequence storage 206 stores signal sequences produced by the synchronizer 102 and synchronizer 104 when no soft error has occurred. For example, if the asynchronous input data changes from logic "0" (0) to logic "1" (1), then the signals at the output terminal 116C and the output terminal 117C will change as shown in one of Tables 1-3 below if no soft error occurs:

TABLE 1

|  | output terminal 116C | output terminal 117C |
|---|---|---|
| $1^{st}$ clock | 0 | 0 |
| $2^{nd}$ clock | 1 | 1 |

TABLE 2

|  | output terminal 116C | output terminal 117C |
|---|---|---|
| $1^{st}$ clock | 0 | 0 |
| $2^{nd}$ clock | 0 | 1 |
| $3^{rd}$ clock | 1 | 1 |

TABLE 3

|  | output terminal 116C | output terminal 117C |
|---|---|---|
| $1^{st}$ clock | 0 | 0 |
| $2^{nd}$ clock | 1 | 0 |
| $3^{rd}$ clock | 1 | 1 |

If the asynchronous input data changes from 1 to 0, then the signals at the output terminal 116C and the output terminal 117C will change as shown in one of Tables 4-6 below if no soft error occurs:

TABLE 4

|  | output terminal 116C | output terminal 117C |
|---|---|---|
| $1^{st}$ clock | 1 | 1 |
| $2^{nd}$ clock | 0 | 0 |

TABLE 5

|  | output terminal 116C | output terminal 117C |
|---|---|---|
| $1^{st}$ clock | 1 | 1 |
| $2^{nd}$ clock | 1 | 0 |
| $3^{rd}$ clock | 0 | 0 |

TABLE 6

|  | output terminal 116C | output terminal 117C |
|---|---|---|
| $1^{st}$ clock | 1 | 1 |
| $2^{nd}$ clock | 0 | 1 |
| $3^{rd}$ clock | 0 | 0 |

The comparison circuitry 204 may compare the data sequence received from the input multiplexer 202 to the data sequences stored in the sequence storage 206, and if the data sequence received from the input multiplexer 202 does not match one of the data sequences stored in the sequence storage 206, then the comparison circuitry 204 may indicate that a soft error has been detected.

In some implementations of the soft error detection circuit 200, the sequence storage 206 stores signal sequences produced by the synchronizer 102 and synchronizer 104 when a soft error occurs. If a soft error occurs in the synchronizer 102 or the synchronizer 104, then the signals at the output terminal 116C and the output terminal 117C may change as shown in one of Tables 7-10.

TABLE 7

|  | output terminal 116C | output terminal 117C |
|---|---|---|
| $1^{st}$ clock | 0 | 0 |
| $2^{nd}$ clock | 0 | 1 |
| $3^{rd}$ clock | 0 | 0 |

TABLE 8

|  | output terminal 116C | output terminal 117C |
|---|---|---|
| $1^{st}$ clock | 0 | 0 |
| $2^{nd}$ clock | 1 | 0 |
| $3^{rd}$ clock | 0 | 0 |

TABLE 9

|  | output terminal 116C | output terminal 117C |
|---|---|---|
| $1^{st}$ clock | 1 | 1 |
| $2^{nd}$ clock | 0 | 1 |
| $3^{rd}$ clock | 1 | 1 |

TABLE 10

|  | output terminal 116C | output terminal 117C |
|---|---|---|
| $1^{st}$ clock | 1 | 1 |
| $2^{nd}$ clock | 1 | 0 |
| $3^{rd}$ clock | 1 | 1 |

The comparison circuitry 204 may compare the data sequence received from the input multiplexer 202 to the data sequences stored in the sequence storage 206, and if the data sequence received from the input multiplexer 202 matches one of the data sequences stored in the sequence storage 206, then the comparison circuitry 204 may indicate that a soft error has been detected.

In some implementations of the soft error detection circuit 200, the comparison circuitry 204 and the sequence storage 206 may implemented in a state machine that monitors the signals received from the input multiplexer 202 for sequences that indicate the presence of a soft error.

Figure 3:
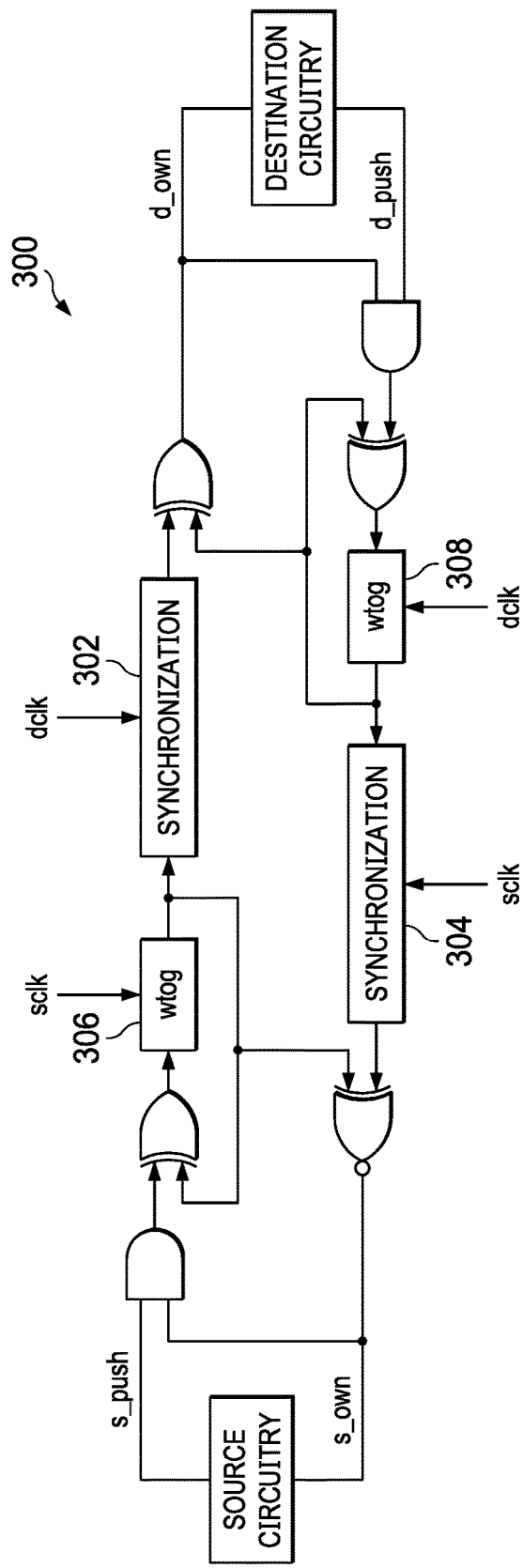
FIG. 3 shows a block diagram for an example toggle occupancy circuit that includes synchronization circuits in accordance with the present disclosure.

FIG. 3 shows a block diagram for an example toggle occupancy circuit 300 that uses synchronization circuits in accordance with the present disclosure. The toggle occupancy circuit 300 includes synchronization circuit 302 and synchronization circuit 304. The synchronization circuit 302 and the synchronization circuit 304 are implementations of the synchronization circuit 100. In the toggle occupancy circuit 300, the source circuitry issues a S_PUSH event that causes the flip-flop 306 to toggle. The flip-flop 306 may include parity or ECC circuitry that protects against soft errors. The synchronization circuit 302 synchronizes the output of the flip-flop 306 to DCLK and the destination circuitry can use data associated with the occupancy cell. When the destination circuitry issues a D_PUSH event, the flip-flop 308 toggles. The flip-flop 308 may include parity or ECC circuitry that protects against soft errors. The synchronization circuit 304 synchronizes the output of the flip-flop 308 to SCLK and the source circuitry regains ownership of the occupancy cell. Use of the synchronization circuit 302 and the synchronization circuit 304 reduces or eliminates faults caused by soft errors in signal synchronization between the source and destination circuitry.

Figure 4:
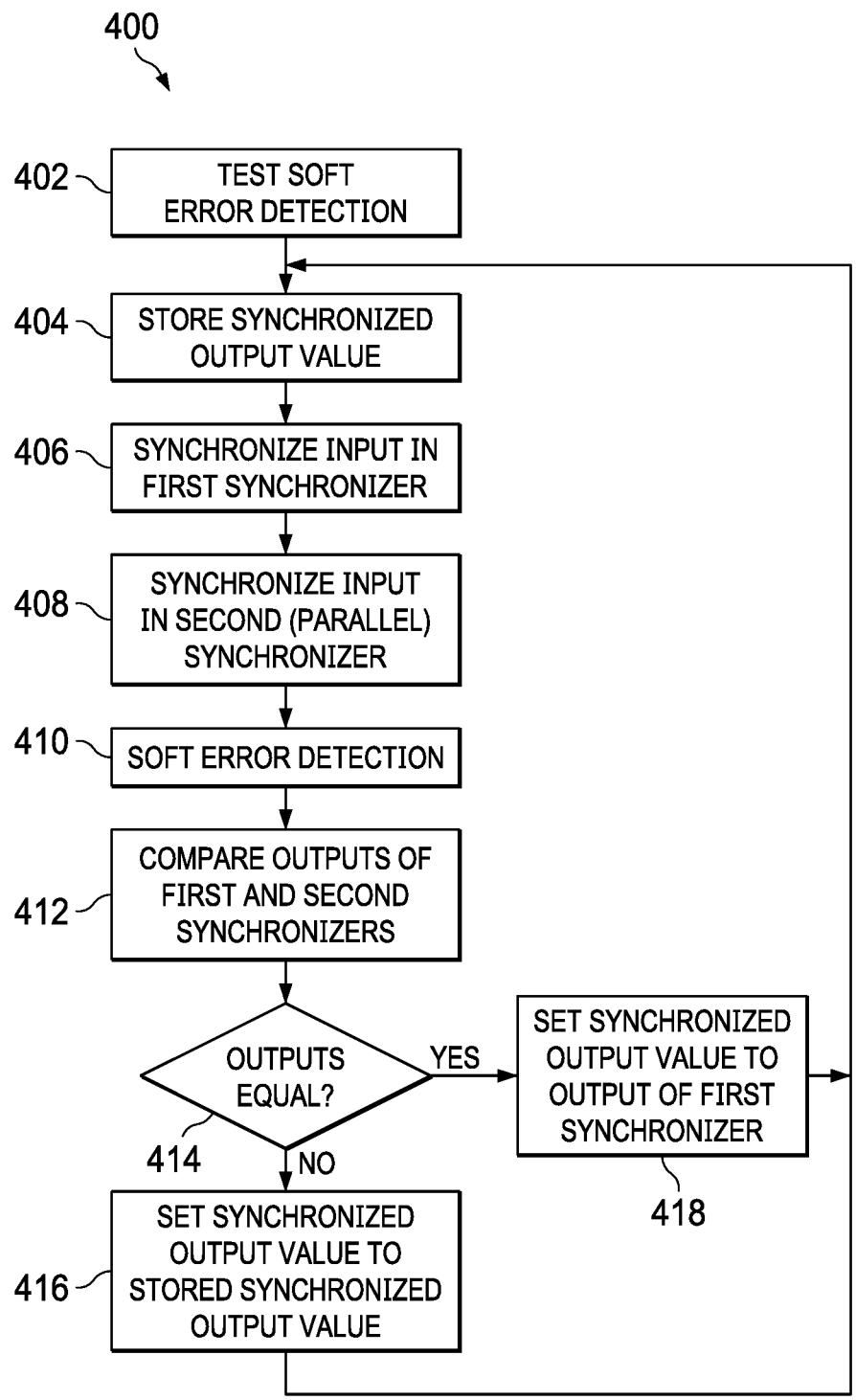
FIG. 4 shows a flow diagram for a method for synchronizing a signal in accordance with the present disclosure.

FIG. 4 shows a flow diagram for a method 400 for synchronizing a signal in accordance with the present disclosure. Though depicted sequentially as a matter of convenience, at least some of the actions shown can be performed in a different order and/or performed in parallel. Additionally, some implementations may perform only some of the actions shown.

In block 402, the soft error detection circuitry 112 is tested to ensure that the presence of soft errors in the output of the synchronizer 102 and the synchronizer 104 can be identified. Details of the testing are provided in the method 600.

In block 404, the synchronized signal value provided at the output terminal 108D of the multiplexer 108 is stored in the storage circuitry 110.

In block 406, the synchronizer 102 synchronizes the asynchronous signal received at the input terminal 124 to the clock signal received at the clock terminal 128.

In block 408, operating in parallel with the synchronizer 102, the synchronizer 104 synchronizes the asynchronous signal received at the input terminal 124 to the clock signal received at the clock terminal 128.

In block 410, the soft error testing circuitry 114 analyzes the output of the synchronizer 102 and the synchronizer 104 to determine whether a soft error has occurred in the synchronizer 102 or the synchronizer 104. Details of the soft error detection are provided in the method 500.

In block 412, the comparison circuitry 106 compares the outputs of the synchronizer 102 and synchronizer 104.

If, in block 414, the output of the synchronizer 102 is the same as the output of the synchronizer 104, then the output of one of the synchronizer 102 or the synchronizer 104 is provided as the synchronized output value at the output terminal 126 in block 418.

If, in block 414, the output of the synchronizer 102 is not the same as the output of the synchronizer 104, then the value stored in the storage circuitry 110 (i.e., a prior synchronized output value present at the output terminal 126) is provided as the synchronized output value at the output terminal 126 in block 416.

Figure 5:
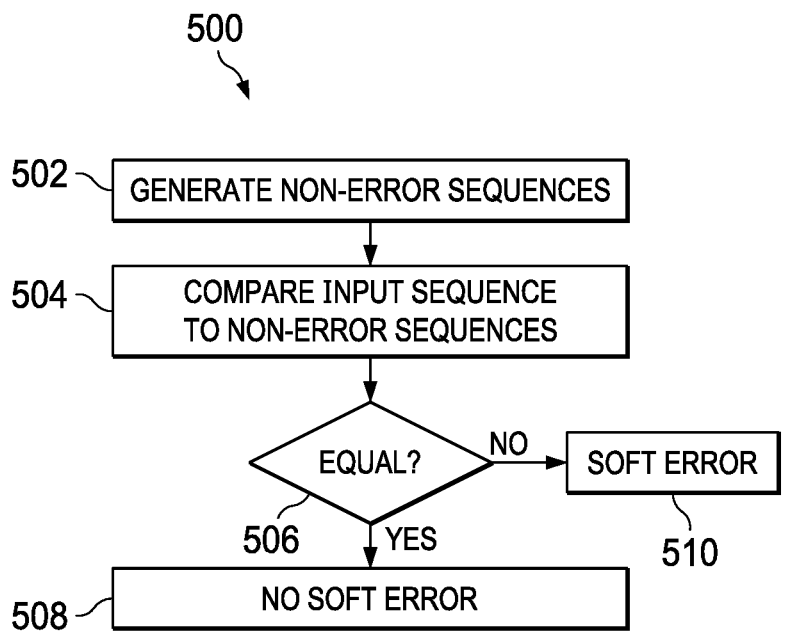
FIG. 5 shows a flow diagram for a method for detecting a soft error in a synchronizer in accordance with the present disclosure.

FIG. 5 shows a flow diagram for a method 500 for detecting a soft error in a synchronizer in accordance with the present disclosure. Though depicted sequentially as a matter of convenience, at least some of the actions shown can be performed in a different order and/or performed in parallel. Additionally, some implementations may perform only some of the actions shown.

In block 502, the sequence storage 206 generates data sequences that correspond to operation of the synchronizer 102 and the synchronizer 104 when no soft error has occurred (see Tables 1-6).

In block 504, the input multiplexer 202 is set to provide the outputs of the synchronizer 102 and the synchronizer 104 to the comparison circuitry 204. The comparison circuitry 204 compares the data sequences generated by the sequence storage 206 to the data sequences received from the synchronizer 102 and the synchronizer 104.

In block 506, if the data sequence received from the synchronizer 102 and the synchronizer 104 is same as one of the data sequences provided by the sequence storage 206, then the comparison circuitry 204 indicates that no soft error is present in block 508.

In block 506, if the data sequence received from the synchronizer 102 and the synchronizer 104 is not same as one of the data sequences provided by the sequence storage 206, then the comparison circuitry 204 indicates that a soft error is present in block 510.

Figure 6:
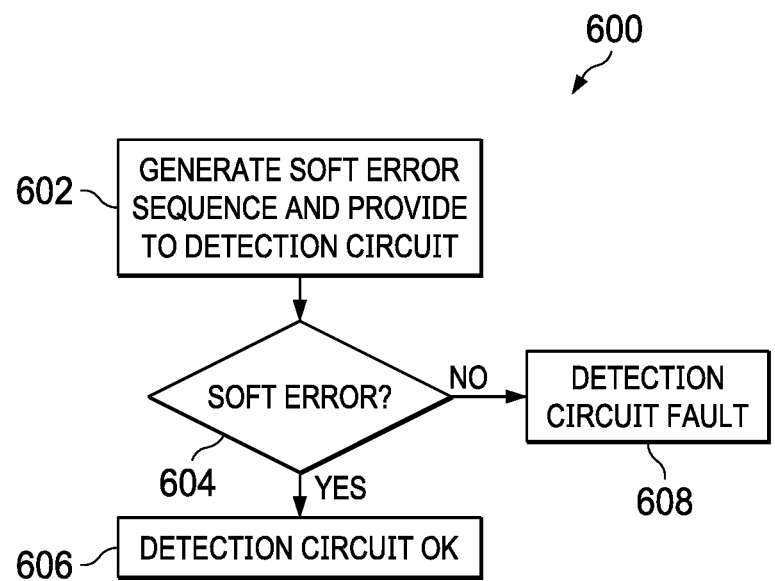
FIG. 6 shows a flow diagram for a method for testing a soft error detection circuit in accordance with the present disclosure.

FIG. 6 shows a flow diagram for a method 600 for testing a soft error detection circuit in accordance with the present disclosure. Though depicted sequentially as a matter of convenience, at least some of the actions shown can be performed in a different order and/or performed in parallel. Additionally, some implementations may perform only some of the actions shown.

In block 602, the input multiplexer 202 is set to provide the outputs of the soft error testing circuitry 114 to the comparison circuitry 204. The soft error testing circuitry 114 generates a data sequence indicative of a soft error in the synchronizer 102 or the synchronizer 104 (see Tables 7-10). The data sequence generated by the soft error testing circuitry 114 is provided to the soft error detection circuitry 112 and the comparison circuitry 204 compares the data sequence received from the soft error testing circuitry 114 to the data sequences provided by the sequence storage 206.

In block 604, if the comparison circuitry 204 indicates that a soft error is present in the data received from the soft error testing circuitry 114, then in block 606, the soft error detection circuitry 112 is operating properly.

In block 604, if the comparison circuitry 204 indicates that no soft error is present in the data received from the soft error testing circuitry 114, then in block 608, the soft error detection circuitry 112 is not operating properly.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A synchronization circuit, comprising:
   a first synchronizer configured to synchronize a received signal to a clock signal;
   a second synchronizer in parallel with the first synchronizer and configured to synchronize the received signal to the clock signal;
   selection circuitry coupled to the first synchronizer and the second synchronizer, the selection circuitry configured to provide an output value generated by the first synchronizer at an output terminal of the synchronization circuit based on the output value generated by the first synchronizer being the same as an output value generated by the second synchronizer; and
   storage circuitry coupled to the selection circuitry, the storage circuitry configured to:
     store a last value provided at the output terminal of the selection circuitry; and
     provide the last value to the selection circuitry.

2. The synchronization circuit of claim 1, wherein the selection circuitry is configured to provide a value stored in the storage circuitry at the output terminal of the synchronization circuit based on the output value generated by the first synchronizer being different from the output value generated by the second synchronizer.

3. The synchronization circuit of claim 1, wherein the storage circuitry comprises soft error protection circuitry.

4. The synchronization circuit of claim 1, wherein the selection circuitry comprises a multiplexer configured to select one of the output value generated by the first synchronizer or the value stored in the storage circuitry to provide at the output terminal of the synchronization circuit.

5. The synchronization circuit of claim 1, wherein the selection circuitry comprises an exclusive-OR circuit coupled to the first synchronizer and the second synchronizer, and configured to compare the output value generated by the first synchronizer to the output value generated by the second synchronizer.

6. The synchronization circuit of claim 1, further comprising soft error detection circuitry coupled to the first synchronizer and the second synchronizer, the soft error detection circuitry configured to identify soft errors in the first synchronizer and the second synchronizer based on a sequence of the output values generated by the first synchronizer and the second synchronizer.

7. The synchronization circuit of claim 6, further comprising test circuitry coupled to the soft error detection circuitry, the test circuitry configured to generate and provide, to the soft error detection circuitry, data representative of the sequence of the output values generated by the first synchronizer and the second synchronizer responsive to a soft error in the first synchronizer or the second synchronizer.

8. A synchronization circuit, comprising:
an input terminal;
a first flip-flop, comprising:
a data input terminal coupled to the input terminal of the synchronizer circuit;
a clock terminal; and
an output terminal;
a second flip-flop, comprising:
a data input terminal coupled to the input terminal of the synchronizer circuit;
a clock terminal coupled to the clock terminal of the first flip-flop; and
an output terminal;
an exclusive-OR circuit, comprising:
a first input terminal coupled the output terminal of the first flip-flip;
a second input terminal coupled to the output terminal of the second flip-flop; and
an output terminal;
a multiplexer comprising:
a first input terminal coupled to the first input terminal of the exclusive-OR circuit;
a second input terminal;
a control terminal coupled to the output terminal of the exclusive-OR circuit; and
an output; and
a third flip-flop comprising:
a data input terminal coupled to the output of the multiplexer; and
an output terminal coupled to the second input terminal of the multiplexer.

9. The synchronization circuit of claim 8, further comprising soft error protection circuitry coupled to the third flip-flop.

10. The synchronization circuit of claim 8, further comprising soft error detection circuitry coupled to the output terminal of the first flip-flop and the output terminal of the second flip-flop.

11. The synchronization circuit of claim 10, wherein the soft error detection circuitry comprises comparison circuitry configured to:
compare a sequence of output values of the first flip-flop and the second flip-flop to a predetermined output value sequence; and
identify a soft error based on the sequence of output values of the first flip-flop and the second flip-flop being different from the predetermined output value sequence.

12. The synchronization circuit of claim 10, further comprising test circuitry coupled to the soft error detection circuitry.

13. The synchronization circuit of claim 12, wherein the test circuitry is configured to generate data values corresponding to a sequence of output values of the first flip-flop and the second flip-flop that include a soft error.

14. A method for synchronization, comprising:
synchronizing an input signal to a clock signal in a first synchronizer;
synchronizing the input signal to the clock signal in a second synchronizer connected in parallel with the first synchronizer;
comparing, by a selection circuitry, an output of the first synchronizer to an output of the second synchronizer;
setting, by the selection circuitry, a synchronized output value to be an output value of the first synchronizer based on the output of the first synchronizer being the same as the output of the second synchronizer;
storing, by a storage circuitry, a last output value by the selection circuitry; and
providing the last output value to the selection circuitry.

15. The method of claim 14, wherein the storage circuitry is a flip-flop.

16. The method of claim 15, further comprising setting the synchronized output value to be an output value of the flip-flop based on the output of the first synchronizer being different from the output of the second synchronizer.

17. The method of claim 14, further comprising:
comparing, by soft error detection circuitry, a sequence of output values of the first synchronizer and the second synchronizer to a predetermined output value sequence;
identifying a soft error in the first synchronizer or the second synchronizer based on the sequence of output values of the first synchronizer and the second synchronizer being different from the predetermined output value sequence.

18. The method of claim 17, further comprising:
generating, by test circuitry, data representative of a sequence of the output values generated by the first synchronizer and the second synchronizer responsive to a soft error in the first synchronizer or the second synchronizer; and
providing the data to the soft error detection circuitry to test the soft error detection circuitry.

* * * * *